US008853616B2

(12) United States Patent
Mukai

(10) Patent No.: US 8,853,616 B2
(45) Date of Patent: Oct. 7, 2014

(54) METHOD OF ADJUSTING TRANSMISSION ELECTRON MICROSCOPE

(71) Applicant: JEOL Ltd., Tokyo (JP)

(72) Inventor: Masaki Mukai, Tokyo (JP)

(73) Assignee: JEOL Ltd., Tokyo (JP)

( * ) Notice: Subject to any disclaimer, the term of this patent is extended or adjusted under 35 U.S.C. 154(b) by 97 days.

(21) Appl. No.: 13/804,380

(22) Filed: Mar. 14, 2013

(65) Prior Publication Data

US 2013/0248699 A1  Sep. 26, 2013

(30) Foreign Application Priority Data

Mar. 21, 2012  (JP) .................................. 2012-63342

(51) Int. Cl.
*H01J 37/02* (2006.01)
*H01J 37/05* (2006.01)
*H01J 37/26* (2006.01)

(52) U.S. Cl.
CPC ....... *H01J 37/023* (2013.01); *H01J 2237/2802* (2013.01); *H01J 2237/057* (2013.01); *H01J 2237/21* (2013.01); *H01J 37/05* (2013.01); *H01J 2237/248* (2013.01); *H01J 37/26* (2013.01)
USPC .................................................... 250/252.1

(58) Field of Classification Search
CPC ......... H01J 37/28; H01J 37/26; H01J 37/023; H01J 2237/21; G01N 23/04; G01N 23/2251; G01N 2223/418
USPC ....................................................... 250/252.1
See application file for complete search history.

(56) References Cited

U.S. PATENT DOCUMENTS

| 5,426,521 A * | 6/1995 | Chen et al. ........................ 359/9 |
| 5,814,815 A * | 9/1998 | Matsumoto et al. ........... 250/311 |
| 7,102,145 B2 * | 9/2006 | Domenicucci et al. ..... 250/492.1 |
| 2009/0242766 A1 * | 10/2009 | Terada et al. ................. 250/311 |

FOREIGN PATENT DOCUMENTS

JP  2004327377 A  11/2004

* cited by examiner

*Primary Examiner* — Marcus Taningco
(74) *Attorney, Agent, or Firm* — The Webb Law Firm

(57) ABSTRACT

There is provided a method of adjusting a transmission electron microscope to facilitate an adjustment for bringing a focal plane of an electron beam exiting a two-stage filter type monochromator into coincidence with an achromatic plane. The method starts with obtaining a transmission electron microscope image including interference fringes of the electron beam that are generated by an aperture located behind the monochromator. The focal plane of the beam exiting the monochromator is brought into coincidence with the achromatic plane by adjusting the intensity of an electrostatic lens, the intensities of the electric and magnetic fields produced by at least one of two energy filters, or astigmatism generated in the monochromator based on an intensity distribution of the interference fringes in the obtained transmission electron microscope image.

10 Claims, 4 Drawing Sheets

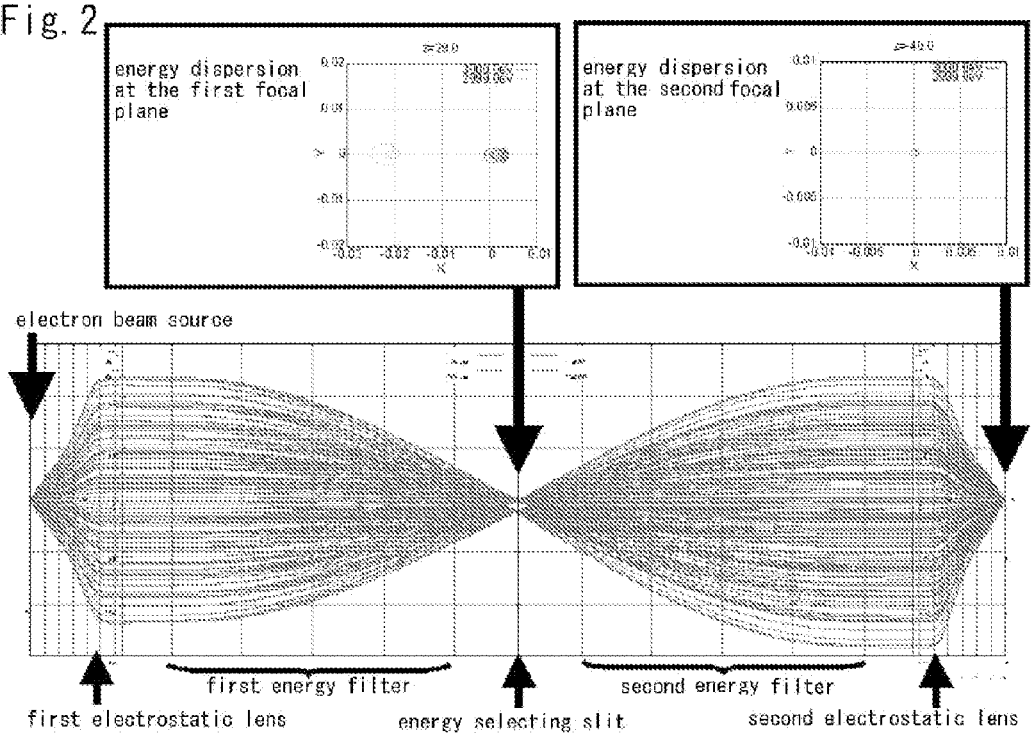

METHOD OF ADJUSTING TRANSMISSION ELECTRON MICROSCOPE

BACKGROUND OF THE INVENTION

1. Field of the Invention

The present invention relates to a method of adjusting a transmission electron microscope equipped with a monochromator that monochromatizes an electron beam.

2. Description of Related Art

In the past, monochromators for monochromatizing electron beams to achieve higher resolutions in electron energy loss spectroscopy (EELS) implemented in transmission electron microscopy have been known (see, for example, JP-A-2004-327377). Various types of monochromators have been proposed. They are classified into two major categories: single-stage filter type and two-stage filter type.

A monochromator of the single-stage filter type is composed of an energy filter acting to spectrally resolve an electron beam and an energy selecting filter. An electron beam emitted from an electron beam source is spectrally separated by the energy filter and focused onto the face of the energy selecting slit. Since the beam is spectrally separated, a spectrum corresponding to a velocity distribution of the electron beam is formed on the energy selecting slit. The energy selecting slit permits only electrons having a certain velocity to pass through the slit, whereby the electron beam is monochromatized. Because the electron beam transmitted through the energy selecting slit forms a spectrum corresponding to the width of the slit at the focal plane, a virtual light source of the electron beam does not assume a circular form. Consequently, in a scanning transmission electron microscope (STEM) image obtained by focusing the electron beam onto a sample, the shape of the light source that is spread along the spectrum is reflected. Anisotropy in resolution appears. Furthermore, in a transmission electron microscope (TEM) image obtained by illuminating a wide area of a sample with an electron beam, anisotropy appears in coherence of the electron beam because of the shape of the virtual light source that is spread along the spectrum.

A monochromator of the two-stage filter type has two stages of energy filters. An energy selecting filter is positioned between the two stages of energy filters. The first stage of energy filter and the energy selecting filter are configured in the same way as in the monochromator of the single-stage filter type. In the monochromator of the two-stage filter type, the energy dispersion of the electron beam transmitted through the energy selecting slit is nullified by the second stage of energy filter, and the focal plane formed after exiting the monochromator agrees with the achromatic plane. The virtual light source at the focal plane of the electron beam which has been achromatized at this plane assumes a circular form. Consequently, in a STEM image obtained by focusing the electron beam onto a sample, the resolution shows no anisotropy and, thus, it is possible to investigate details of the electronic state of a substance by high resolution electron energy loss spectroscopy at a spatial resolution on the order of nanometers or sub-nanometers. Furthermore, in a TEM image obtained by illuminating a wide area of a sample with an electron beam, isotropic coherence of the electron beam at the virtual light source in the form of a spot is combined with further decreases in the effects of chromatic aberration owing to irradiation by a monochromatized electron beam. Hence, higher resolution imaging is enabled.

The great advantage of the monochromator of the two-stage filter type over the monochromator of the single-stage filter type is that a virtual light source of an electron beam that is monochromatized and achromatized is obtained. To achieve this feature, it is necessary that the optical system for use with the monochromator of the two-stage filter type be set up so as to satisfy two requirements: convergence of the electron beam on the energy selecting slit and achromatization at the focal plane formed after exiting from the monochromator. However, because of the complex structure of the monochromator of the two-stage filter type, achieving these requirements in the optical system of a practical instrument involves difficulties. Especially, it is difficult to judge whether it is possible to make an adjustment successfully on achromatization at the focal plane formed after exiting the monochromator.

SUMMARY OF THE INVENTION

In view of the foregoing problems, the present invention has been made. According to some aspects of the present invention, a method of adjusting a transmission electron microscope in such a way that an adjustment for bringing a focal plane of an electron beam exiting a monochromator of the two-stage filter type into coincidence with an achromatic plane can be easily performed.

(1) The present invention provides a method of adjusting a transmission electron microscope equipped with a monochromator which is used to monochromatize an electron beam and which includes a first energy filter for dispersing the electron beam according to kinetic energy, an energy selecting filter disposed at an energy dispersive plane, and a second energy filter for nullifying energy dispersion of the electron beam transmitted through the energy selecting slit. An aperture is located behind the monochromator and produces interference fringes of the electron beam. The method starts with obtaining a transmission electron microscope image including the interference fringes. Then, an adjustment is made based on an intensity distribution of the interference fringes in the transmission electron microscope image to bring a focal plane of the electron beam exiting the monochromator into coincidence with an achromatic plane.

In the present invention, the transmission electron microscope image may be a TEM image or a STEM image.

According to the present invention, interference fringes of the electron beam are created by the aperture located behind the monochromator. The adjustment for bringing the focal plane and chromatic plane into coincidence is made based on the intensity distribution of the interference fringes in the transmission electron microscope image. Therefore, this adjustment for bringing the focal plane and chromatic plane into coincidence can be performed with greater ease, for example, than where the adjustment is made while directly observing the shape of the spot of the electron beam in a transmission electron microscope image.

(2) In one feature of this method of adjusting a transmission electron microscope in accordance with the present invention, the step of making an adjustment may also be carried out by adjusting the intensity of an electrostatic lens mounted ahead of the monochromator based on the intensity distribution of the interference fringes in the transmission electron microscope image to bring the focal plane of the electron beam exiting the monochromator into coincidence with the achromatic plane.

In this method of the invention having this feature, the intensity of the electrostatic lens is adjusted based on the intensity distribution of interferences in the transmission electron microscope image, thereby bringing the focal plane into coincidence with the achromatic plane. As a consequence, the adjustment for bringing the focal plane and the achromatic plane into coincidence can be carried out easily.

(3) In another feature of the above-described method of adjusting a transmission electron microscope in accordance with the present invention, the step of making an adjustment may also be carried out by adjusting the intensities of electric and magnetic fields produced by at least one of the first and second energy filters based on the intensity distribution of the interference fringes in the transmission electron microscope image to bring the achromatic plane of the electron beam exiting the monochromator into coincidence with the focal plane.

In this method of the invention having this feature, the achromatic plane is brought into coincidence with the focal plane by adjusting the intensities of the electric and magnetic fields produced by at least one of the first and second energy filters based on the intensity distribution of the interference fringes in the transmission electron microscope image. As a consequence, the adjustment for bringing the focal plane and the achromatic plane into coincidence can be carried out easily.

(4) In a further feature of the above-described method of adjusting a transmission electron microscope in accordance with the present invention, the step of making an adjustment may also be carried out by adjusting astigmatism produced in the monochromator based on the intensity distribution of the interference fringes in the transmission electron microscope image to bring the focal plane of the electron beam exiting the monochromator into coincidence with the achromatic plane.

In this method of the invention having this feature, in a case where the monochromator can induce astigmatism in the electron beam by producing an electric or magnetic quadrupole field, the astigmatism in the monochromator is adjusted based on the intensity distribution of interferences in the transmission electron microscope image, thereby bringing the focal plane into coincidence with the achromatic plane. As a consequence, the adjustment for bringing the focal plane and the achromatic plane into coincidence can be carried out easily.

(5) In an additional feature of the above-described method of adjusting a transmission electron microscope in accordance with the present invention, the step of making an adjustment may also be carried out by adjusting the intensity of a magnetic lens located ahead of the monochromator based on the intensity distribution of the interference fringes in the transmission electron microscope image to bring the focal plane of the electron beam exiting the monochromator into coincidence with the achromatic plane.

In this method of the invention having this feature, the focal plane is brought into coincidence with the achromatic plane by adjusting the intensity of the magnetic lens based on the intensity distribution of the interference fringes in the transmission electron microscope image. Consequently, the adjustment for bringing the focal plane and the achromatic plane into coincidence can be carried out easily.

(6) In the method of adjusting a transmission electron microscope in accordance with the present invention, the aperture may be a condenser lens aperture.

According to the present invention, the adjustment for bringing the focal plane and the achromatic plane into coincidence can be performed by employing the condenser lens aperture intrinsically present in the transmission electron microscope.

BRIEF DESCRIPTION OF THE DRAWINGS

FIG. 2 is a ray diagram of the orbit of the electron beam in the monochromator shown in FIG. 1.

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. Configuration

Figure 1:
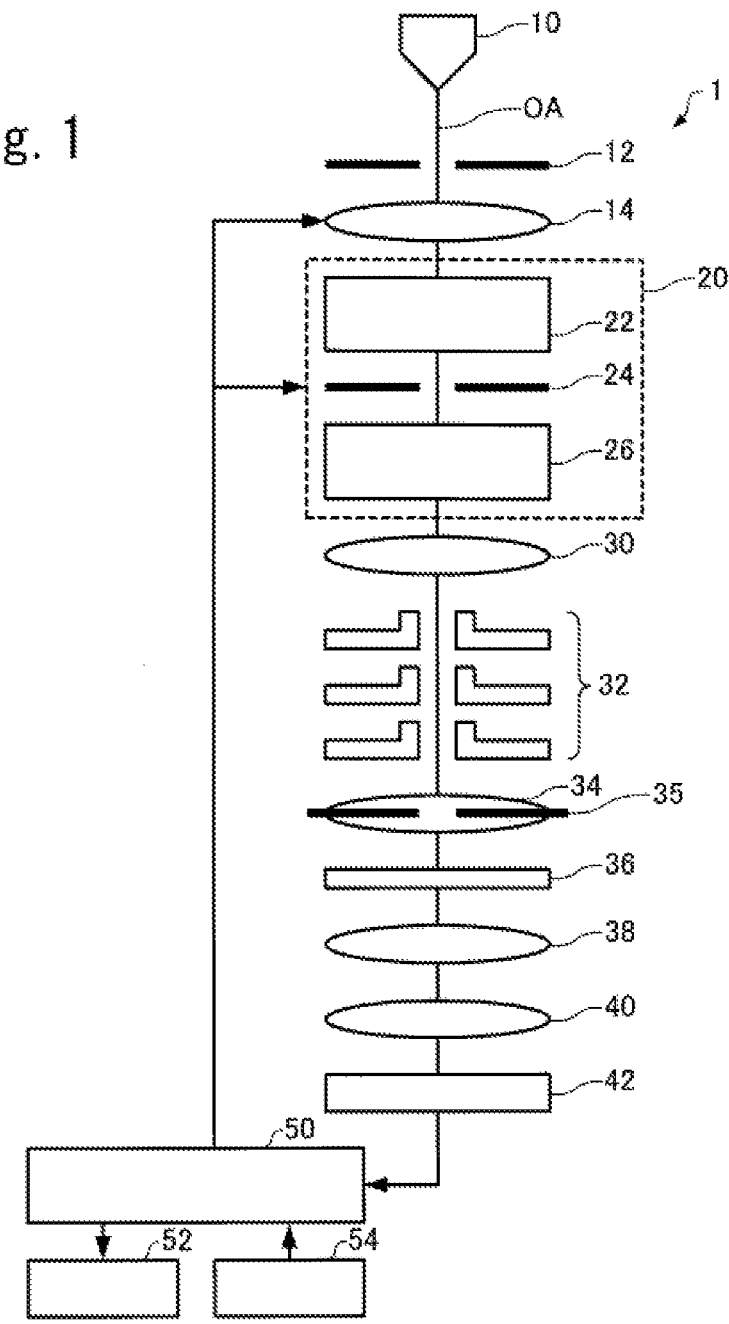
FIG. 1 is a diagram showing the structure of an electron microscope according to one embodiment of the present invention.

One example of configuration of an electron microscope associated with one embodiment of the present invention is shown in FIG. 1. It is now assumed that the electron microscope is designed as a transmission electron microscope (TEM). Alternatively, the electron microscope may be designed as a scanning transmission electron microscope (STEM). Some parts of the microscope according to the present embodiment as shown in FIG. 1 may be omitted.

Referring to FIG. 1, the electron microscope, generally indicated by reference numeral 1, includes an electron beam source 10, an aperture 12, a first electrostatic lens 14, a monochromator 20, a second electrostatic lens 30, an acceleration tube 32, an illumination lens system 34, a sample stage 36 for holding a sample, an objective lens 38, a projector lens system 40, a detector 42, a processing portion 50, a manual control portion 52, and a display portion 54.

The electron beam source 10 has a cathode for emitting electrons and an anode for accelerating the electrons such that they are released from the beam source as an electron beam. One example of the electron beam source 10 is a well-known electron gun.

The first electrostatic lens 14 is located ahead of the monochromator 20 to adjust the orbit of the electron beam emitted from the electron beam source 10 (i.e., the incident angle of the electron beam incident on the monochromator 20). The first electrostatic lens 14 is controlled by an electrostatic lens controller (not shown), which in turn controls the intensity of the first electrostatic lens 14 in response to a control signal from the processing portion 50. The second electrostatic lens 30 is located behind the monochromator 20 to adjust the orbit of the electron beam directed at the sample.

The monochromator 20 is of the two-stage filter type and operates to monochromatize the electron beam. The monochromator 20 includes a first energy filter 22 for dispersing the beam according to kinetic energy, an energy selecting slit 24 disposed at an energy dispersive plane, and a second energy filter 26 for nullifying the energy dispersion of the electron beam transmitted through the energy selecting slit 24.

Each of the first energy filter 22 and second energy filter 26 is made of a Wien filter for applying an electric field and a magnetic field, which are perpendicular to each other, to the electron beam traveling along the optical axis OA. Note that the electric field and magnetic field produced by the second energy filter 26 are opposite in sense to the electric field and magnetic field produced by the first energy filter 22. The first and second energy filters 22, 26 are controlled by their respective energy filter controllers (not shown), which in turn control the intensities of the electric and magnetic fields developed by the first and second energy filters 22, 26 in response to control signals from the processing portion 50.

FIG. 2 is a ray diagram showing the orbit of the electron beam in the monochromator 20. The electron beam emitted from the electron beam source 10 is spectrally separated by the first energy filter 22 and focused onto a first focal plane at which the energy selecting slit 24 is disposed. Since the beam is spectrally separated, a spectrum corresponding to a velocity distribution of the electron beam is formed at the first focal plane. The energy selecting slit 24 permits passage of only electrons of the beam which are within a given distance from the optical axis OA along the electric field. The energy dispersion of the electron beam transmitted through the slit 24 is nullified by the second energy filter 26. Ideally, a plane (hereinafter may be referred to as the second focal plane) at which the electron beam exiting the monochromator 20 is focused is coincident with an achromatic plane at which the energy dispersion is nullified. In this case, a virtual light source at the second focal plane of the electron beam assumes a circular form.

The electron beam monochromatized by the monochromator 20 is accelerated by the acceleration tube 32 and directed at the sample stage 36 by the illumination lens system 34. The illumination lens system 34 is made up of a plurality of condenser lenses. A condenser lens aperture 35 is formed in the illumination lens system 34.

The objective lens 38 is located behind the sample stage 36 to focus the electron beam transmitted through the sample. The projector lens system 40 is positioned behind the objective lens 38 to enlarge the image focused by the objective lens 38 and to focus the image onto the detector 42. The projector lens system 40 is made up of an intermediate lens and a projector lens.

The detector 42 is located behind the projector lens system 40 to detect the transmission electron microscope image focused by the projector lens system 40. One example of the detector 42 is a CCD camera having a photosensitive surface made up of a two-dimensional array of CCDs (charge-coupled devices). Image information of the transmission electron microscope image detected by the detector 42 is output to the processing portion 50.

The manual control portion 52 permits a user to enter manual control information. The manual control portion 52 outputs the entered manual control information to the processing portion 50. The functions of the manual control portion 52 can be realized by hardware devices such as a keyboard, a mouse, and a touch panel display.

The display portion 54 displays an image generated by the processing portion 50. The function of the display portion can be realized by an LCD, a CRT, or the like. The display portion 54 displays a transmission electron microscope image created by the processing portion 50.

The processing portion 50 as consisting of a computer performs processing operations for controlling the electrostatic lens controller and the energy filter controller and processing operations for acquiring transmission electron microscope images. The functions of the processing portion 50 can be realized by hardware devices such as various processors (such as CPU and DSP) or computer programs.

The processing portion 50 performs a processing operation for acquiring a transmission electron microscope image (TEM image) by acquiring image information delivered from the detector 42. Furthermore, the processing portion 50 generates various control signals based on manual control information entered from the manual control portion 52 and outputs the signals to the electrostatic lens controller and energy filter controller to control the intensity of the first electrostatic lens 14 and the intensities of the electric and magnetic fields produced by the first and second energy filters 22, 26 or to control the electric or magnetic quadrupole field produced in the monochromator 20.

2. Technique of the Present Embodiment

In the method of adjusting an electron microscope in accordance with the present embodiment, the adjustment for bringing the focal plane of the electron beam leaving the monochromator 20 into coincidence with the achromatic plane by obtaining a transmission electron microscope image including interference fringes of the electron beam created by the condenser lens aperture 35 and observing an intensity distribution of the interference fringes in the obtained transmission electron microscope image is made. The aperture for forming the interference fringes is not limited to the condenser lens aperture 35. Any aperture may be used as long as it is located behind the monochromator 20.

Where a focal point (virtual light source) of the electron beam present ahead of the condenser lens aperture 35 is sufficiently small, the electron beam interferes with the electron beam diffracted by the condenser lens aperture 35, resulting in interference fringes in the transmission electron microscope image. Where the energy dispersion of the electron beam remains at the focal plane of the beam exiting the monochromator 20 (i.e., the focal plane of the electron beam is not coincident with the achromatic plane), the virtual light source is spread along the spectrum and so no isotropic interferences occur but rather anisotropy appears in the interference fringes. On the other hand, where the focal plane of the electron beam leaving the monochromator 20 is coincident with the achromatic plane, the virtual light source forms a circular spot. Consequently, interference fringes appear isotropically. That is, concentric interference fringes in which the intensities do not vary greatly in the peripheral direction appear.

In the method of adjusting an electron microscope in accordance with the present embodiment, the adjustment is made to bring the focal plane of the electron beam exiting the monochromator 20 into coincidence with the achromatic plane by observing variations in an intensity distribution of interference fringes when the intensity of the first electrostatic lens 14, the intensities of the electric and magnetic fields produced by the first and second energy filters 22, 26, or astigmatism produced in the monochromator 20 is varied.

Figure 3A:
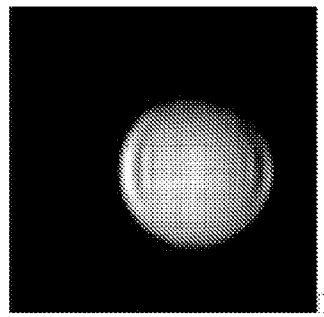
FIGS. 3(A), 3(B), and 3(C) show interference fringes observed in a case where the intensity of the first electrostatic lens shown in FIG. 1 is varied.
Figure 3B:
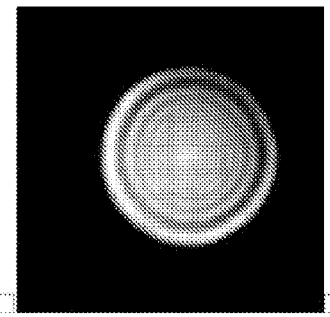
Figure 3C:
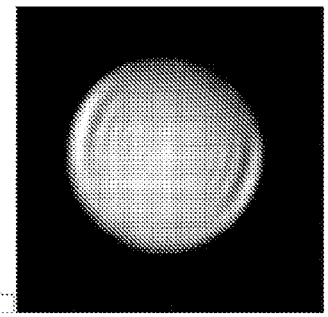

FIGS. 3(A)-3(C) show interference fringes observed when the intensity of the first electrostatic lens 14 is varied. When the intensity of the first electrostatic lens 14 is varied, the incident angle of the beam incident on the monochromator 20 varies and the position of the focal plane of the beam exiting the monochromator 20 changes. That is, the position of the focal plane can be varied independently while maintaining the position of the achromatic plane stationary by varying the intensity of the first electrostatic lens 14. If the focal plane is brought into coincidence with the achromatic plane by varying the intensity of the first electrostatic lens 14, the interference fringes appearing in the transmission electron microscope image show the highest contrast. Among the interference fringes of FIGS. 3(A)-3(C), the interference fringes of FIG. 3(B) show the least variation of intensity in the peripheral direction. Therefore, it is seen that the settings under which the interference fringes of FIG. 3(B) appear are optimal for the first electrostatic lens 14. In particular, the adjustment can be made to bring the focal plane of the electron beam into coincidence with the achromatic plane by adjusting the intensity of the first electrostatic lens 14 such that the interference fringes in the transmission electron microscope image appear most isotropically.

Figure 4A:
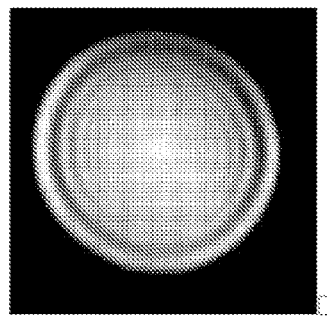
FIGS. 4(A), 4(B), and 4(C) show interference fringes observed in a case where the intensities of electric and magnetic fields produced by the first and second energy filters shown in FIG. 1 are varied.
Figure 4B:
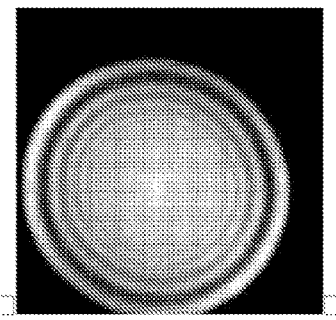
Figure 4C:
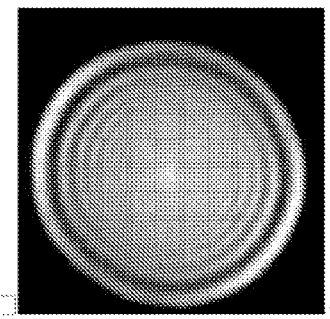

FIGS. 4(A)-4(C) show interference fringes observed when the intensities of the electric and magnetic fields produced by the first and second energy filters 22, 26 are varied. When the intensities of the electric and magnetic fields produced in the first energy filter 22 or the intensities of the electric and magnetic fields produced in the second energy filter 26 are varied, the position of the achromatic plane of the electron beam exiting the monochromator 20 varies. That is, the position of the achromatic plane can be varied independently while maintaining the position of the focal plane stationary by varying the intensities of electric and magnetic fields produced by any one of the first and second energy filters 22, 26. If the achromatic plane is brought into coincidence with the focal plane by varying the intensities of the electric and magnetic fields produced by any one of the first and second energy filters 22, 26, the interference fringes appearing in the transmission electron microscope image show the highest contrast. Among the examples shown in FIGS. 4(A)-4(C), the interference fringes of FIG. 4(B) show the least variations in the intensity in the peripheral direction. Thus, it can be seen that the settings under which the interference fringes of FIG. 4(B) appear are optimal for the first and second energy filters 22, 26. In particular, the adjustment for bringing the achromatic plane of the electron beam into coincidence with the focal plane can be carried out by adjusting the intensities of the electric and magnetic fields produced by any one of the first and second energy filters 22, 26 such that interference fringes appear in the transmission electron microscope image most isotropically.

Figure 5A:
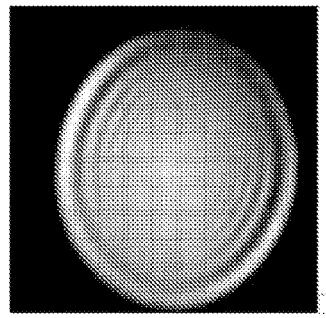
FIGS. 5(A), 5(B), and 5(C) show interference fringes observed in a case where astigmatism produced in the monochromator shown in FIG. 1 is varied.
Figure 5B:
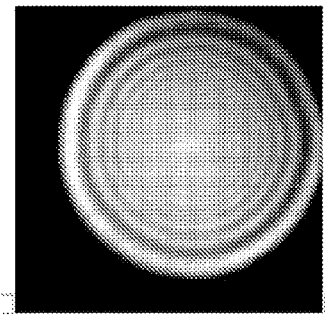
Figure 5C:
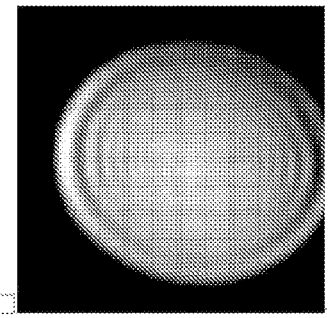

FIGS. 5(A)-5(C) show interference fringes observed when astigmatism generated in the monochromator 20 is varied. Where the monochromator 20 is so designed that it can produce an electric or magnetic quadrupole field, astigmatism can be generated in the electron beam within the monochromator 20. If the direction in which astigmatism is generated in the monochromator 20 is set in the spectral direction of the first and second energy filters 22, 26 and if the amount of the generated astigmatism is varied, the position of the focal plane of the beam exiting the monochromator 20 along the spectrum changes. If the focal plane agrees with the achromatic plane as a result of variation of the astigmatism in the monochromator 20, interference fringes appearing in the transmission electron microscope image exhibit the highest contrast. In the examples of FIGS. 5(A)-5(C), the interference fringes of FIG. 5(B) show the least variation of intensity in the peripheral direction and, therefore, it is seen that the settings under which the interference fringes of FIG. 5(B) appear are optimal for the monochromator 20. That is, the adjustment for bringing the focal plane of the electron beam into coincidence with the achromatic plane can be carried out by adjusting astigmatism generated in the monochromator 20 such that interference fringes in the transmission electron microscope image appear most isotropically.

In this way, in the electron microscope adjusting method according to the present embodiment, the adjustment for bringing the focal plane into coincidence with the astigmatic plane can be easily carried out by varying the intensity of the first electrostatic lens 14, varying the intensities of the electric and magnetic fields produced by at least one of the first and second energy filters 22, 26, or varying astigmatism generated in the monochromator 20 on the basis of an intensity distribution of interference fringes in a transmission electron microscope image. Since an intensity distribution of interference fringes in a transmission electron microscope image varies conspicuously according to the positional relationship between the focal plane and the achromatic plane, the adjustment can be made more easily than where the shape of a spot of the electron beam in a transmission electron microscope is directly observed.

3. Modifications

It is to be understood that the present invention is not restricted to the above-described embodiment and that various changes and modifications are possible within the scope and spirit of the invention. The present invention embraces configurations (e.g., configurations identical in function, method, and results or identical in purpose and advantageous effects) which are substantially identical to the configurations described in the above embodiment. Furthermore, the invention embraces configurations which are similar to the configurations described in the above embodiment except that its nonessential portions have been replaced. Additionally, the invention embraces configurations which are identical in advantageous effects to or which can achieve the same object as the configurations described in the above embodiment. Further, the invention embraces configurations which are similar to the configurations described in the above embodiment except that a well-known technique is added.

Figure 6:
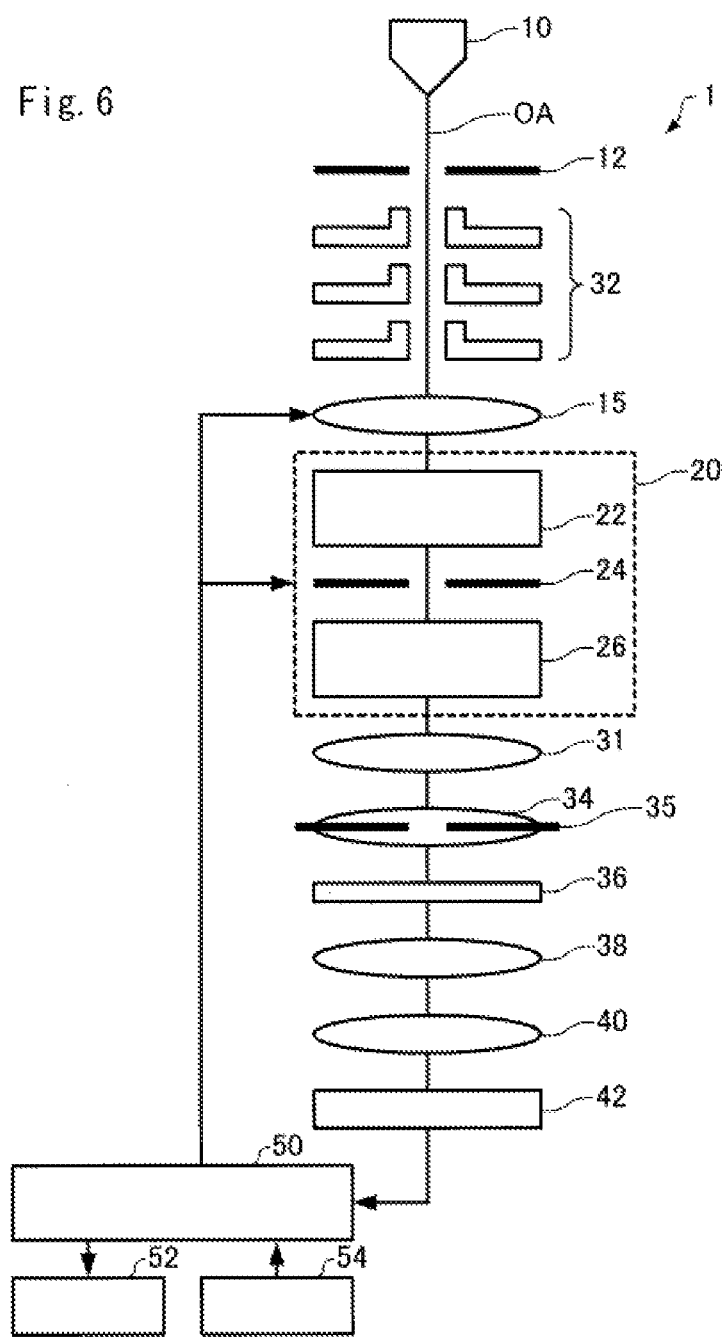
FIG. 6 is a diagram similar to FIG. 1 but illustrating a modified embodiment of the present invention.

For example, in the above embodiment, the electron microscope where the monochromator 20 is disposed ahead of the acceleration tube 32 is taken as an example. The present invention can also be applied to an electron microscope in which the monochromator 20 is disposed behind the acceleration tube 32. In this case, as shown in FIG. 6, magnetic lenses (first magnetic lens 15 and second magnetic lens 31) are disposed respectively ahead of and behind the monochromator 20 instead of electrostatic lenses. In both FIGS. 1 and 6, the same configurations are indicated by the same reference numerals and a description of those components which have been already described will be omitted below.

In the example of FIG. 6, when the intensity of the first magnetic lens 15 is varied, the incident angle of the electron beam impinging on the monochromator 20 varies. This varies the position of the focal plane of the electron beam exiting the monochromator 20. That is, the position of the focal plane can be varied independently while maintaining the position of the achromatic plane stationary by varying the intensity of the first magnetic lens 15. If the focal plane agrees with the achromatic plane as a result of a variation of the intensity of the first magnetic lens 15, interference fringes appearing in a transmission electron microscope show the highest contrast. That is, the adjustment for bringing the focal plane of the electron beam into coincidence with the achromatic plane can be made by adjusting the intensity of the first magnetic lens 15 such that interference fringes appear most isotropically in the transmission electron microscope image.

Having thus described my invention with the detail and particularity required by the Patent Laws, what is desired protected by Letters Patent is set forth in the following claims.

The invention claimed is:

1. A method of adjusting a transmission electron microscope equipped with a monochromator that monochromatizes an electron beam, the monochromator including a first energy filter for dispersing the electron beam according to kinetic energy, an energy selecting slit disposed at an energy dispersive plane, and a second energy filter for nullifying energy dispersion of the electron beam transmitted through the energy selecting slit, said method comprising:

obtaining a transmission electron microscope image including interference fringes of the electron beam produced by an aperture located behind the monochromator; and making an adjustment for bringing a focal plane of the electron beam exiting the monochromator into coincidence with an achromatic plane based on an intensity distribution of the interference fringes in the transmission electron microscope image.

2. A method of adjusting a transmission electron microscope as set forth in claim 1, wherein said step of making an adjustment is carried out by adjusting the intensity of an electrostatic lens mounted ahead of the monochromator based on the intensity distribution of the interference fringes in the transmission electron microscope image to bring the focal plane of the electron beam exiting the monochromator into coincidence with the achromatic plane.

3. A method of adjusting a transmission electron microscope as set forth in claim 1, wherein said step of making an adjustment is carried out by adjusting the intensities of the electric and magnetic fields produced by at least one of the first and second energy filters based on the intensity distribution of the interference fringes in the transmission electron microscope image to bring the achromatic plane of the electron beam exiting the monochromator into coincidence with the focal plane.

4. A method of adjusting a transmission electron microscope as set forth in claim 1, wherein said step of making an adjustment is carried out by adjusting astigmatism produced in the monochromator based on the intensity distribution of the interference fringes in the transmission electron microscope image to bring the focal plane of the electron beam exiting the monochromator into coincidence with the achromatic plane.

5. A method of adjusting a transmission electron microscope as set forth in claim 1, wherein said step of making an adjustment is carried out by adjusting the intensity of a magnetic lens located ahead of the monochromator based on the intensity distribution of the interference fringes in the transmission electron microscope image to bring the focal plane of the electron beam exiting the monochromator into coincidence with the achromatic plane.

6. A method of adjusting a transmission electron microscope as set forth in claim 1, wherein said aperture is a condenser lens aperture.

7. A method of adjusting a transmission electron microscope as set forth in claim 2, wherein said aperture is a condenser lens aperture.

8. A method of adjusting a transmission electron microscope as set forth in claim 3, wherein said aperture is a condenser lens aperture.

9. A method of adjusting a transmission electron microscope as set forth in claim 4, wherein said aperture is a condenser lens aperture.

10. A method of adjusting a transmission electron microscope as set forth in claim 5, wherein said aperture is a condenser lens aperture.

* * * * *